(12) United States Patent
Tatsukami et al.

(10) Patent No.: US 9,030,818 B2
(45) Date of Patent: May 12, 2015

(54) ELECTRONIC DEVICE AND ELASTIC SLIDE LOCK MEMBER

(71) Applicant: Fujitsu Limited, Kawasaki-shi, Kanagawa (JP)

(72) Inventors: Ikki Tatsukami, Tama (JP); Takashi Abe, Kawasaki (JP); Ryohei Sato, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 195 days.

(21) Appl. No.: 13/924,039

(22) Filed: Jun. 21, 2013

(65) Prior Publication Data

US 2014/0091693 A1 Apr. 3, 2014

(30) Foreign Application Priority Data

Sep. 28, 2012 (JP) .................. 2012-218252

(51) Int. Cl.
*G06F 1/16* (2006.01)
*H05K 5/02* (2006.01)

(52) U.S. Cl.
CPC ............ *H05K 5/0221* (2013.01); *G06F 1/1635* (2013.01); *G06F 1/1656* (2013.01)

(58) Field of Classification Search
USPC ......... 455/566, 575.3, 575.4, 575.5; 439/629, 439/658, 263, 607.17, 395, 595, 404, 489, 439/153, 862, 154; 29/527.2; 312/9.12, 312/9.15, 405, 107, 319.1, 326, 334.46, 312/334.47, 607.17; 174/66; 16/49, 228, 16/326, 334, 429; 361/679.07, 679.21, 361/679.01, 679.58, 679.43, 679.33, 361/679.55, 679.57
See application file for complete search history.

(56) References Cited

U.S. PATENT DOCUMENTS

| 2012/0115368 | A1* | 5/2012 | Tanaka et al. ................. | 439/629 |
| 2012/0162954 | A1 | 6/2012 | Tachikawa et al. | |
| 2013/0102365 | A1* | 4/2013 | Oh et al. ....................... | 455/566 |

FOREIGN PATENT DOCUMENTS

| EP | 0944121 A1 | 9/1999 |
| JP | 59-180484 U | 12/1984 |
| JP | 11-274758 A | 10/1999 |
| JP | 2000-022347 A | 1/2000 |
| JP | 2012-141803 A | 7/2012 |

* cited by examiner

*Primary Examiner* — Hung Duong
(74) *Attorney, Agent, or Firm* — Westerman, Hattori, Daniels & Adrian, LLP

(57) ABSTRACT

An electronic device includes: a housing provided with an opening that accommodates a component; a cover member that covers the opening; a projecting part that projects from an inside face of the housing; a slide knob slidably provided to a surface of the housing; and an elastic slide lock member that fixes the cover member to the housing, wherein the elastic slide lock member includes: a movement part that is coupled to the slide knob, moves together with the slide knob, and is provided with a fixing projection; a fixing part that is rotatably supported by the projecting part of the housing; and a coupling part that couples the movement part and the fixing part and is elastically deformable.

10 Claims, 14 Drawing Sheets

ELECTRONIC DEVICE AND ELASTIC SLIDE LOCK MEMBER

CROSS-REFERENCE TO RELATED APPLICATION

This application is based upon and claims the benefit of priority of the prior Japanese Patent Application No. 2012-218252, filed on Sep. 28, 2012, the entire contents of which are incorporated herein by reference.

FIELD

The embodiments discussed herein are related to an electronic device that includes a slide lock mechanism.

BACKGROUND

In a portable electronic device, a battery is used as a driving power supply. The battery is mounted in a housing of the electronic device as a battery pack. The battery pack is replaceable. The battery pack is accommodated in a battery pack accommodating part in an opening provided to part of the housing of the electronic device. The opening of the housing is covered with a cover.

Related art is disclosed in Japanese Laid-open Patent Publication No. 2012-141803 or Japanese Laid-open Patent Publication No. 2000-22347.

SUMMARY

According to one aspect of the embodiments, an electronic device includes: a housing provided with an opening that accommodates a component; a cover member that covers the opening; a projecting part that projects from an inside face of the housing; a slide knob slidably provided to a surface of the housing; and an elastic slide lock member that fixes the cover member to the housing, wherein the elastic slide lock member includes: a movement part that is coupled to the slide knob, moves together with the slide knob, and is provided with a fixing projection; a fixing part that is rotatably supported by the projecting part of the housing; and a coupling part that couples the movement part and the fixing part and is elastically deformable.

The object and advantages of the invention will be realized and attained by means of the elements and combinations particularly pointed out in the claims.

It is to be understood that both the foregoing general description and the following detailed description are examples and explanatory and are not restrictive of the invention, as claimed.

DESCRIPTION OF EMBODIMENTS

A slide lock mechanism is used for fixing a cover to a housing. In the slide lock mechanism, the cover becomes fixed or unfixed by a user causing a slide knob provided to the housing to slide. The slide lock mechanism includes a latch-type slide lock mechanism and a spring-type slide lock mechanism.

When the slide knob is caused to slide in the latch-type slide lock mechanism, the slide knob is held or latched at a position to which the slide knob is caused to slide. For example, when the slide knob is caused to slide to a fixing position, the slide knob is maintained at the fixing position and a state in which the cover is fixed is maintained. When the slide knob is caused to slide to a fixing canceling position, the slide knob is maintained at the fixing canceling position and a state in which the cover is unfixed is maintained. In the spring-type slide lock mechanism, the slide knob is urged to the fixing position by a spring and maintained at the fixing position. When canceling the fixing, a user causes the slide knob to slide to the fixing canceling position. When the user releases the slide knob, the slide knob returns to the fixing position automatically by spring force and the cover is maintained in the fixed state.

With the miniaturization of an electronic device, a battery pack is also miniaturized. A cover that covers an opening of a battery pack accommodating part may also be miniaturized and a space around the battery pack and the cover may be decreased, and a slide lock mechanism for fixing the cover may be miniaturized as well.

Figure 1:
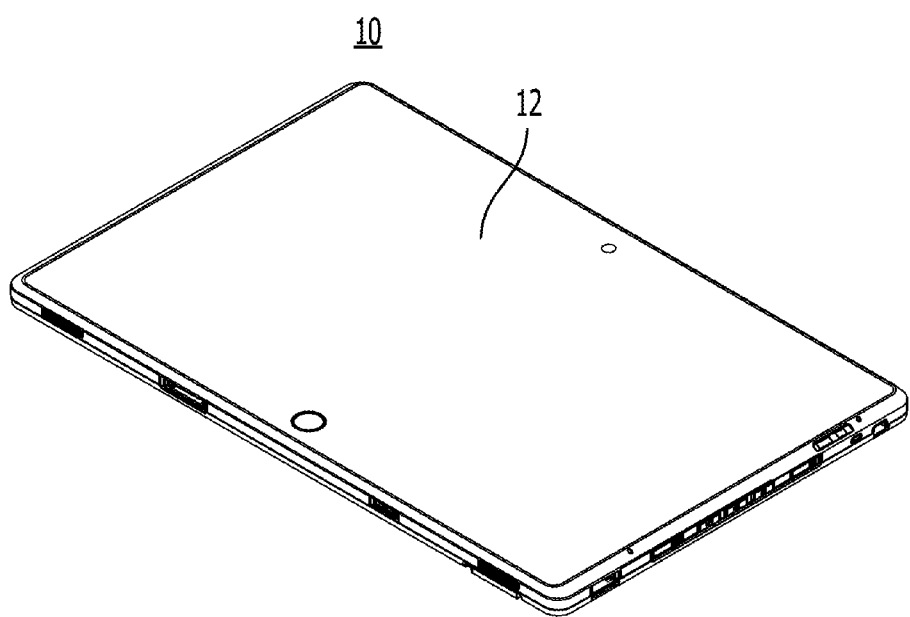
FIG. 1 illustrates an example of an electronic device.

FIG. 1 illustrates an example of an electronic device. The electronic device illustrated in FIG. 1 may be a small-sized tablet terminal, and a perspective view of a small-sized tablet terminal 10 is depicted. The front face side of the tablet terminal 10 is provided with a liquid crystal display (LCD) part 12. A user causes the LCD part 12 to display various kinds of information or images, or inputs various kinds of information on a screen of the LCD part 12. The tablet terminal 10 is a portable electronic apparatus and is provided with a battery pack as a power source.

Figure 2:
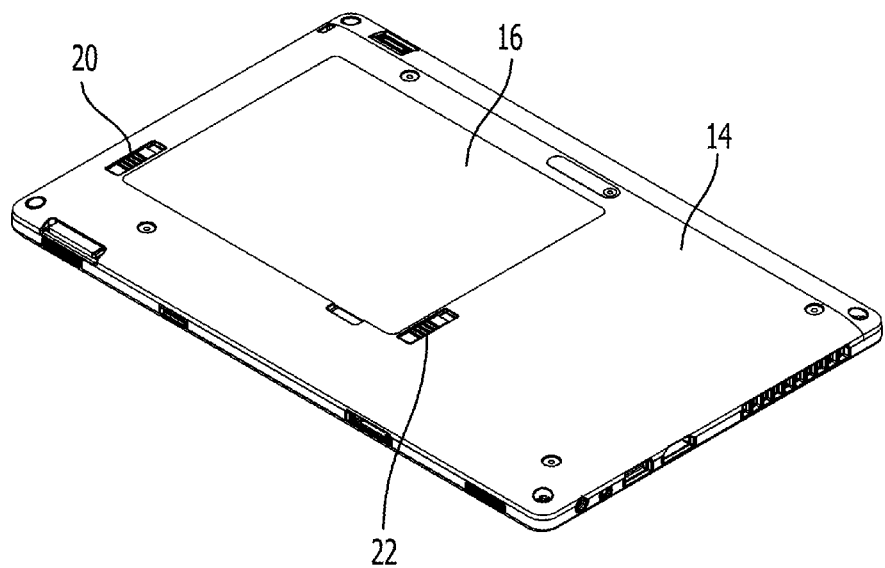
FIG. 2 illustrates an example of an electronic device.

FIG. 2 illustrates an example of an electronic device. The electronic device illustrated in FIG. 2 may be a small-sized tablet terminal and a perspective view viewed from the back side of the small-sized tablet terminal 10 is depicted. An accommodating part that accommodates the battery pack is provided in the tablet terminal 10. The battery pack accommodating part is provided in an opening provided to the back side of a housing 14, and when the battery pack is accommodated in the accommodating part, the opening is closed with a cover 16. A portion that corresponds to the cover 16 may be integrally formed in the battery pack itself. When the cover 16 is fixed, the battery pack may also be fixed.

Two slide lock mechanisms are provided so as to fix the cover 16 to the housing 14. A slide knob 20 of one of the slide lock mechanisms is provided to a portion along one of the shorter sides of the cover 16 that is approximately rectangular. A slide knob 22 of the other slide lock mechanism is provided to a portion along the other shorter side of the cover 16.

The slide lock mechanism that includes the slide knob 20 is a spring-type slide lock mechanism 30 and the slide knob 20 is urged to the fixing position. The slide lock mechanism that includes the slide knob 22, meanwhile, is a latch-type slide lock mechanism 40 and the slide knob 22 is held at the fixing position or the fixing canceling position.

Since the spring-type slide lock mechanism 30 and the latch-type slide lock mechanism 40 are provided at different positions on the periphery of a single cover, which is the cover 16, unexpected separation of the cover 16 may be avoided. For example, some external force may act on the slide knobs 20 and 22 and both of the slide knobs 20 and 22 may slide to the fixing canceling position, and the cover 16 may separate from the housing 14. When the cover 16 separates from the housing 14, the battery pack accommodated in the accommodating part may be exposed and the battery pack may also separate from the accommodating part in the housing 14. When the battery pack and the cover 16 are integrally formed, the cover 16 and the battery pack may separate.

In many cases, while external force is acting on the slide knobs 20 and 22, force that presses the cover 16 against the housing 14 is acting, and in this state, the cover 16 may remain at the housing 14. When the external force acting on the slide knob 22 is removed, the slide knob 22 of the latch-type slide lock mechanism 40 is held at the fixing canceling position. Accordingly, the cover 16 is not fixed by the latch-type slide lock mechanism 40. When the external force acting on the slide knob 20 of the spring-type slide lock mechanism 30 is removed, the slide knob 20 automatically returns to the fixing position. Accordingly, the cover 16 is fixed by the spring-type slide lock mechanism 30.

In the spring-type slide lock mechanism 30 of the two slide lock mechanisms, even when the slide knob 20 is unexpectedly caused to slide to the fixing canceling position, the slide knob 20 automatically slides to the fixing position and fixes the cover 16 on removal of the external force acting on the slide knob 20. Thus, the separation of the cover 16 and the battery pack may be avoided.

The spring-type slide lock mechanism 30 and the latch-type slide lock mechanism 40 are miniaturized and simplified, and therefore may be included in a miniaturized electronic apparatus.

Figure 3:
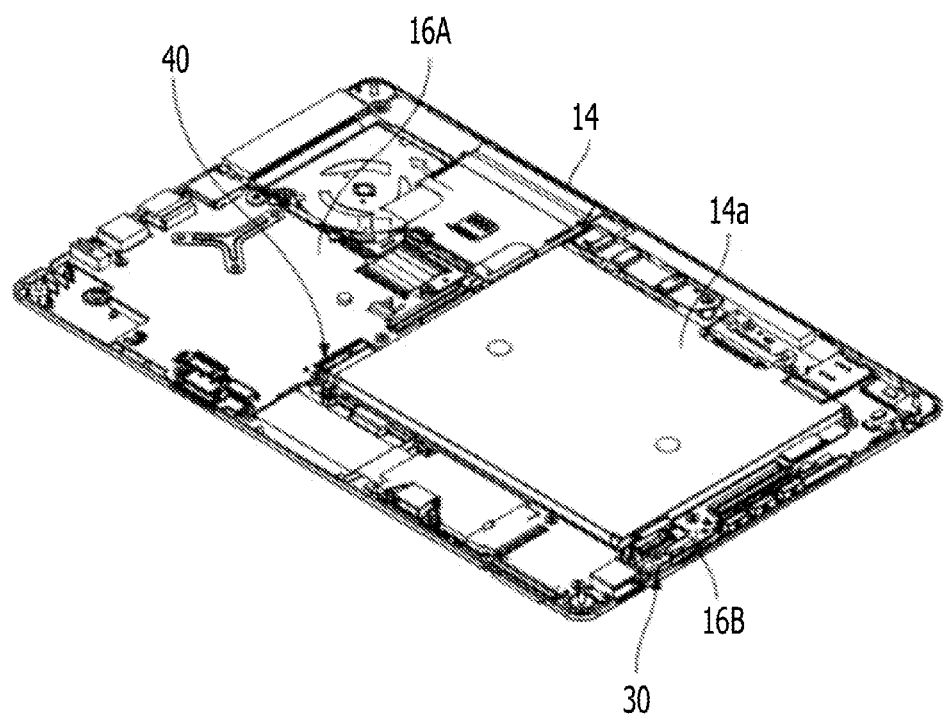
FIG. 3 illustrates an example of a tablet terminal.

FIG. 3 illustrates an example of a tablet terminal. FIG. 3 depicts a perspective view of the tablet terminal 10 illustrated in FIG. 1, from which the LCD part 12 is removed such that the inside of the tablet terminal 10 is visible. In FIG. 3, the back side of a bottom plate 14a of the rectangular accommodating part that accommodates the battery pack is depicted. The spring-type slide lock mechanism 30 that includes the slide knob 20 is arranged between one of the shorter sides of the accommodating part and one of the shorter sides of the housing 14. In FIG. 3, most of the spring-type slide lock mechanism 30 may be hidden under a board 16B. The latch-type slide lock mechanism 40 is arranged in the vicinity of the other shorter side of the accommodating part. Most of the latch-type slide lock mechanism 40 may be covered with a board 16A and in FIG. 3, only part of the latch-type slide lock mechanism 40 may be depicted.

Figure 4:
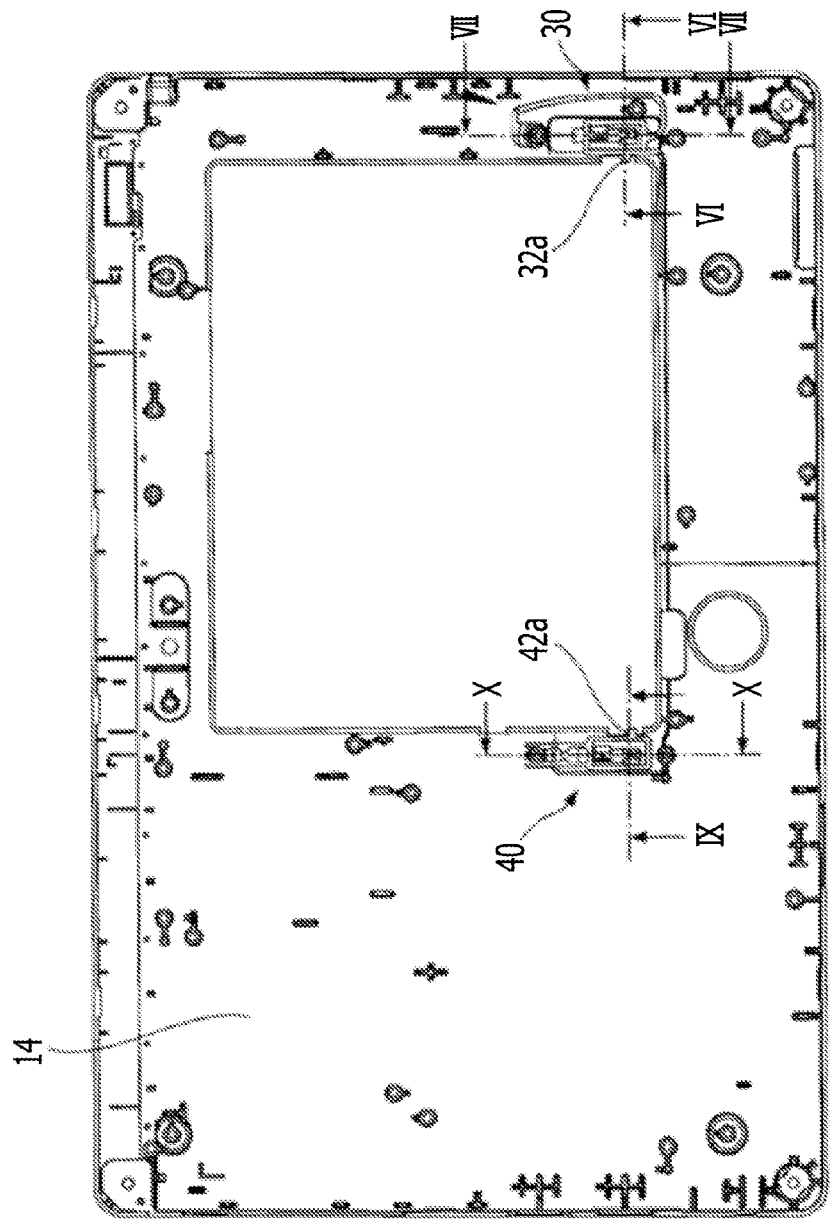
FIG. 4 illustrates an example of a housing.

FIG. 4 illustrates an example of a housing. In FIG. 4, a plan view viewed from the inside of the housing 14 is depicted. A state in which the spring-type slide lock mechanism 30 and the latch-type slide lock mechanism 40 are mounted is illustrated.

The spring-type slide lock mechanism 30 is short in size in the longitudinal direction and is miniaturized. Thus, the spring-type slide lock mechanism 30 is used as a fixing mechanism for fixing the cover 16 of the tablet terminal 10, which is a small-sized electronic device.

Figure 5:
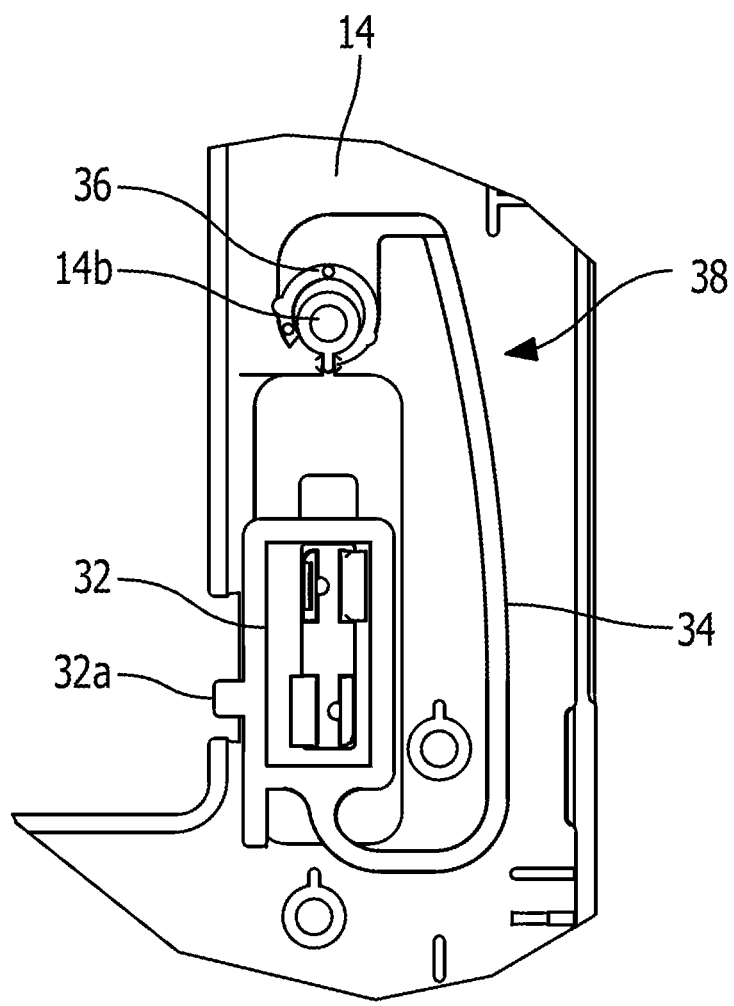
FIG. 5 illustrates an example of a spring-type slide lock mechanism.

FIG. 5 illustrates an example of a spring-type slide lock mechanism. In FIG. 5, an enlarged view of a portion to which the spring-type slide lock mechanism 30 illustrated in FIG. 4 is provided is depicted. The spring-type slide lock mechanism 30 includes the slide knob 20, a slide frame 32 to which the slide knob 22 is fixed, a spring part 34 that extends from the slide frame 32 and is shaped like an arch, and a fixing part 36 provided to the top end of the spring part 34. The slide frame 32, the spring part 34, and the fixing part 36 may be a single member integrally formed of resin. The single member may be a spring-type slide lock member 38. The slide frame 32 that moves together with the slide knob 20 may correspond to a movement part. The spring part 34 that couples the slide frame 32, which may correspond to the movement part, and the fixing part 36 may correspond to a coupling part that is elastically deformable. The spring-type slide lock mechanism 30 may be an elastic slide lock mechanism, and the spring part 34 may be used as an elastic member. The spring part 34 may provide elasticity and may be an elastic body, such as a plate spring made of resin or metal, a rubber material, or a coil spring.

Figure 6:
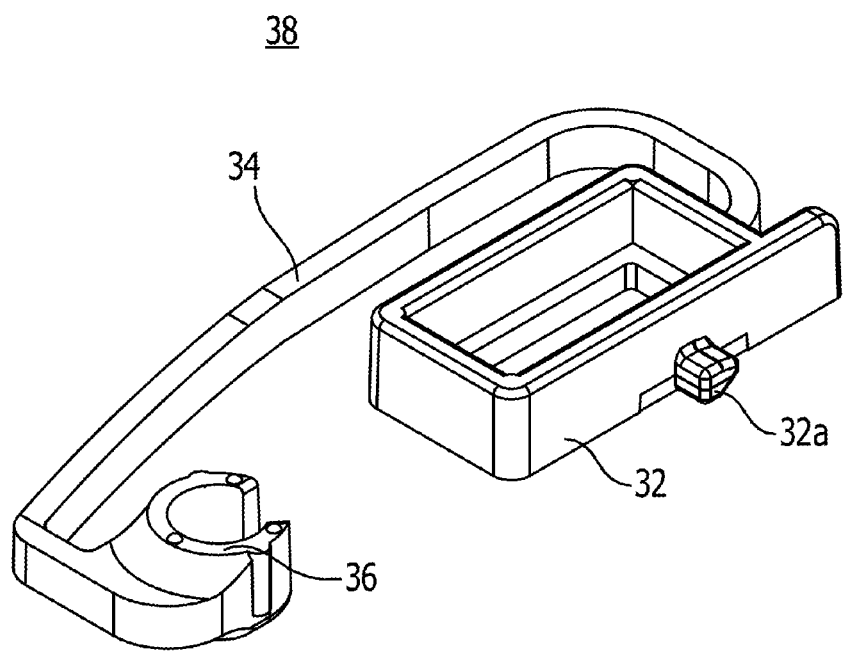
FIG. 6 illustrates an example of a spring-type slide lock member.

FIG. 6 illustrates an example of an elastic slide lock member. In FIG. 6, a perspective view of the spring-type slide lock member 38 is depicted. The slide frame 32 corresponds to a frame-shaped portion that is approximately rectangular, and a lock projection 32a projecting out is formed on the outside face of the slide frame 32. The lock projection 32a may engage with part of the cover 16 or part of the battery pack integrated with the cover 16 and correspond to a portion for fixing the cover 16. The slide knob 22 is attached to the slide frame 32, and when the slide knob 20 is caused to slide, the slide frame 32 moves together.

Figure 7:
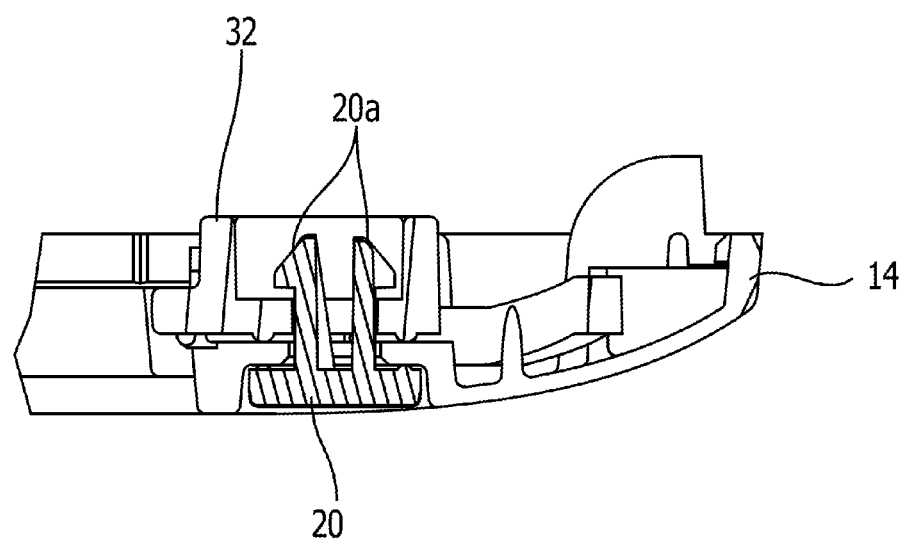
FIG. 7 illustrates an example of a cross section of a housing.
Figure 8:
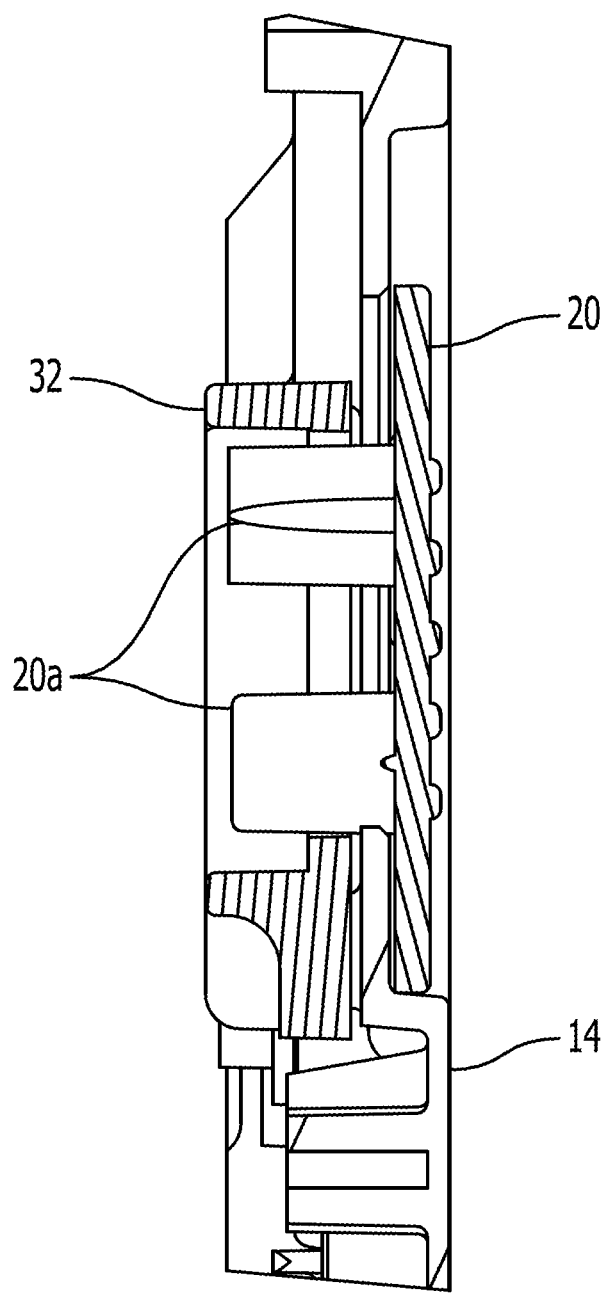
FIG. 8 illustrates an example of a cross section of a housing.

Each of FIGS. 7 and 8 illustrates an example of a cross section of the housing 14. FIG. 7 is a sectional view along line VI-VI in FIG. 4. FIG. 8 is a sectional view along line VII-VII in FIG. 4. The slide knob 20 is provided outside the housing 14 and at a position that faces the slide frame 32 located inside the housing 14. An engaging part 20a extending from the slide knob 20 penetrates the housing 14 and engages with the inside of the slide frame 32. Thus, the slide knob 20 is fixed to the slide frame 32 via the housing 14. When the slide knob 20 slides, the slide frame 32 moves. When the slide frame 32 moves, the lock projection 32a moves and the fixing or the fixing cancellation of the cover 16 is performed.

As illustrated in FIG. 5, the fixing part 36 of the spring-type slide lock member 38 is rotatably fitted and fixed with respect to a boss 14b formed so as to project from the housing 14. The slide frame 32 of the spring-type slide lock member 38 is movable in a direction toward or away from the fixing part 36. For example, when the slide knob 20 is caused to slide, the slide frame 32 moves in the direction toward or away from the fixing part 36. When the slide knob 20 is at the fixing position, the slide frame 32 is at a position away from the fixing part 36. When the slide knob 20 is at the fixing canceling position, the slide frame 32 is at a position close to the fixing part 36.

Figure 9A:
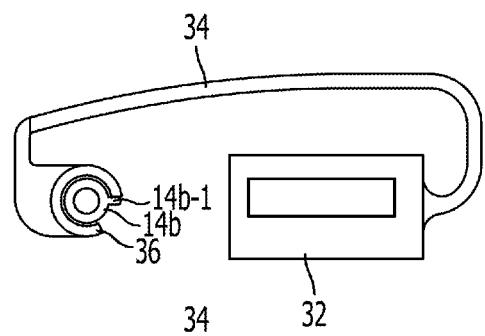
FIGS. 9A to 9D illustrate an example of operations of a spring-type slide lock member.

FIGS. 9A to 9D illustrate an example of operations of a spring-type slide lock member. When the slide knob 20 is not operated, the slide frame 32 is at the position away from the fixing part 36 as illustrated in FIG. 9A. In the state illustrated in FIG. 9A, no force may be applied to the spring part 34 that connects the slide frame 32 and the fixing part 36, and the spring part 34 may be neither elastically deformed nor bent.

Figure 9B:
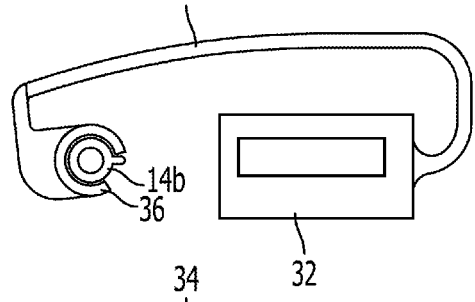

When the slide knob 20 is caused to slide from the fixing position to the fixing canceling position, the slide frame 32 moves toward the fixing part 36 while elastically deforming the spring part 34 as illustrated in FIG. 9B. At this time, the fixing part 36 engages with the boss 14b of the housing 14 to be fixed, and is rotatable about the boss 14b. Thus, when the spring part 34 attempts to bend, a component of force that causes the fixing part 36 to rotate occurs and the fixing part 36 slightly rotates.

Figure 9C:
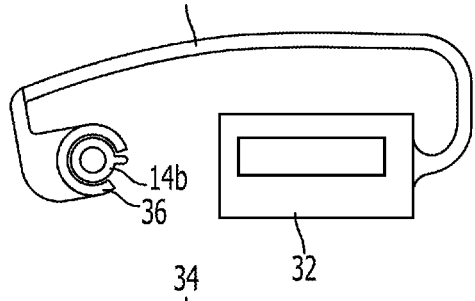
Figure 9D:
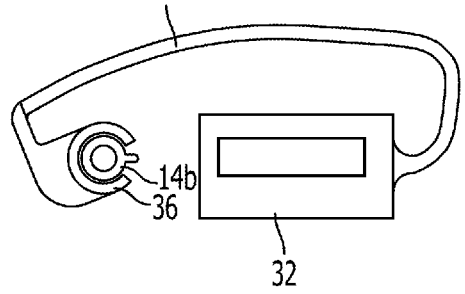

When the slide knob 20 slides further toward the fixing canceling position, as illustrated in FIG. 9C, the spring part 34 is elastically deformed further and the fixing part 36 also rotates further. When the slide knob 22 reaches the fixing canceling position, the spring part 34 is elastically deformed further and the fixing part 36 also rotates further as illustrated in FIG. 9D. This state may correspond to the state in which the fixing of the cover 16 is canceled.

Since the spring part 34 is elastically deformed or bent in the state illustrated in FIG. 9D, returning force caused by the elastic deformation acts on the slide knob 20. For example, the slide knob 20 is pressed against the elastic force of the spring part 34 so as to maintain the state illustrated in FIG. 9D.

When the force being applied to the slide knob 20 is released, the slide frame 32 is urged in the direction away from the fixing part 36 by elastic reversion force caused by the spring part 34 attempting to retrieve an original shape, and returns to the state illustrated in FIG. 9A. Thus, the slide knob 20 is caused to slide to the fixing position. When the spring part 34 returns from the elastic deformation and the slide frame 32 moves away from the fixing part 36, the fixing part 36 also rotates in the opposite direction and returns to the state illustrated in FIG. 9A.

In the spring-type slide lock member 38, the fixing part 36 rotates about the boss 14b as the spring part 34 is elastically deformed. When the fixing part 36 rotates, the elastic deformation of the spring part 34 is reduced. For example, the amount of the elastic deformation of the spring part 34 is decreased, compared to the case in which the fixing part 36 is fixed without rotating, and the slide knob 20 slides with smaller force. For example, when the amount of the elastic deformation of the spring part 34 is the same, the slide frame 32 may move by a longer distance with respect to the fixing part 36 because of the rotation of the fixing part 36. Thus, in a small space, the distance by which the slide frame 32 moves may be increased and the spring-type slide lock mechanism 30 may be simplified and miniaturized.

The housing 14 may be molded by die casting using a magnesium alloy. Since the boss 14b is integrally formed of the magnesium alloy, the boss 14b is provided with a projection 14b-1 in view of the molding quality in performing the die casting. Thus, the fixing part 36 of the spring-type slide lock member 38 is provided with a hole that is partially cut away, and this hole fits the boss 14b. When the boss 14b is shaped like a cylinder that does not include the projection 14b-1, the hole provided to the fixing part 36 of the spring-type slide lock member 38 may have no lacking portion and the cross section of the hole may be shaped like a complete circle. Since an end face of the lacking portion of the hole of the fixing part 36 comes into contact with the projection 14b-1 of the boss 14b, the rotation of the fixing part 36 in the opposite direction may be avoided.

When the positions of the fixing part 36 and the slide frame 32 are close to each other because of the operations of the spring-type slide lock member 38, the distance by which the slide frame 32 moves may be long. Thus, when the spring-type slide lock member 38 is placed in a small space and when, for example, the spring-type slide lock member 38 is small in size, the distance by which the slide frame 32 moves, such as a stroke, may be long. Since the distance by which the slide knob 20 slides is set to be sufficient, force for causing the slide knob 20 to slide may be reduced. Since the fixing part 36 is rotatable, the spring-type slide lock member 38 may be miniaturized while securing a sufficient slide distance. The spring-type slide lock mechanism 30 that is miniaturized and includes a simplified structure may be provided.

As illustrated in FIG. 4, the latch-type slide lock mechanism 40 includes the slide knob 22, a slide frame 42, and a latch part 44 extending from the slide frame 42. The latch part 44 includes a pair of arms 44a and 44b. The pair of arms 44a and 44b fixes the position of the slide frame 42 by sandwiching a boss 14c that is formed so as to project from the housing 14 and engaging with the boss 14c. Similar to the slide frame 32 of the spring-type slide lock member 38, the slide frame 42 is provided with a lock projection 42a. The lock projection 42a may be a portion that engages with part of the cover 16 or part of the battery pack integrated with the cover 16 and fixes the cover 16. The slide knob 22 is attached to the slide frame 42 and when the slide knob 22 is caused to slide, the slide frame 42 moves together. The slide frame 42 and the latch part 44 may be integrally formed of resin as a latch-type slide lock member 48. The latch-type slide lock member 48 may be formed by fixing the latch part 44 to the slide frame 42.

Figure 10:
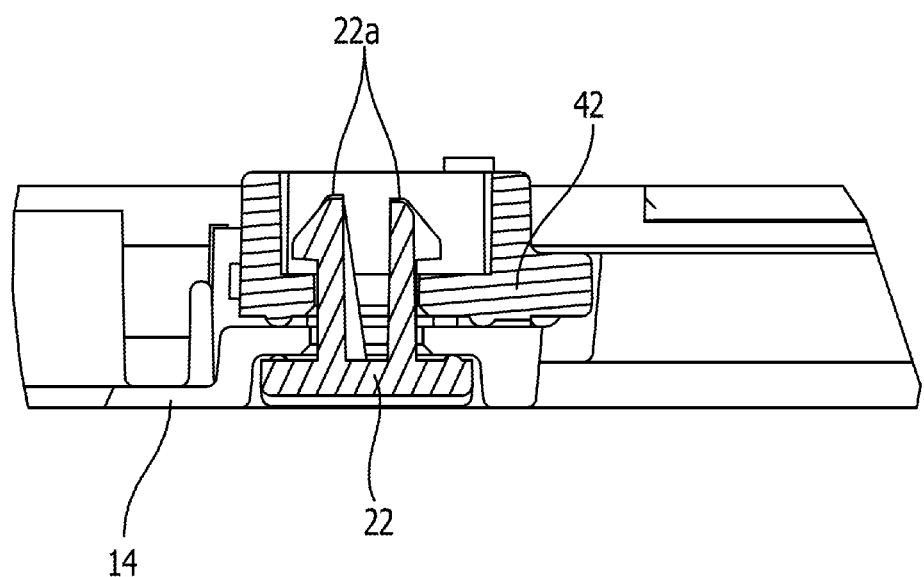
FIG. 10 illustrates an example of a cross section of a housing.
Figure 11:
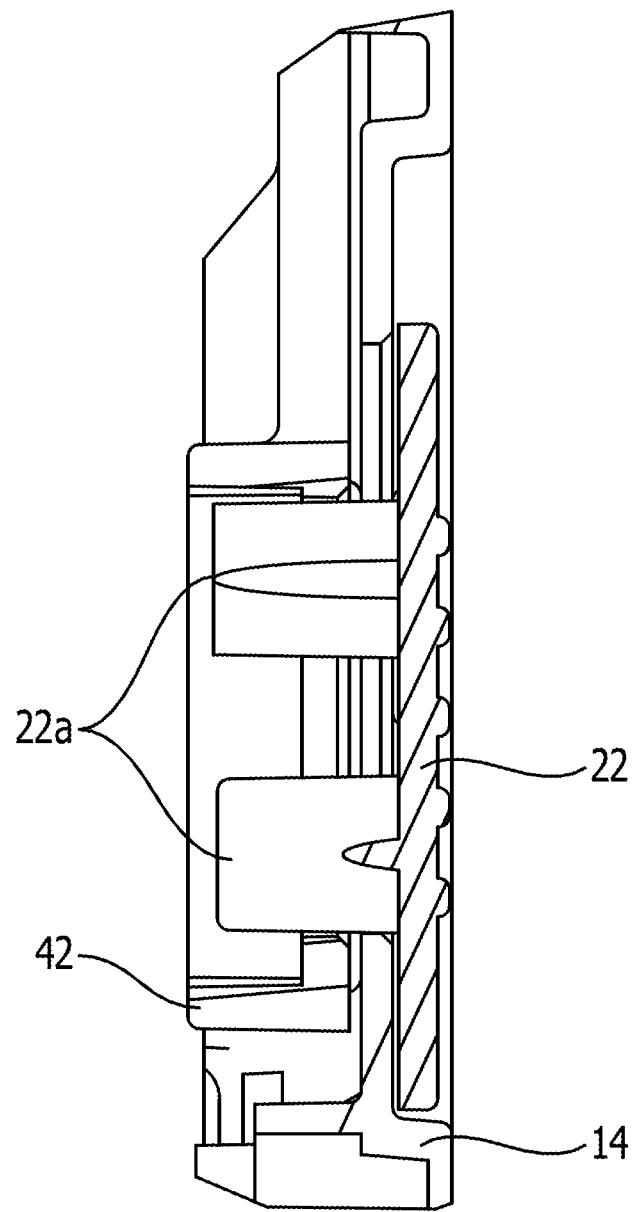
FIG. 11 illustrates an example of a cross section of a housing.

Each of FIGS. 10 and 11 illustrates an example of a cross section of a housing. FIG. 10 illustrates a sectional view along line IX-IX in FIG. 4. FIG. 11 illustrates a sectional view along line X-X in FIG. 4. The slide knob 22 is arranged outside the housing 14 and at a position that faces the slide frame 42 located inside the housing 14. An engaging part 22a extending from the slide knob 22 penetrates through the housing 14 and engages with the inside of the slide frame 42. Thus, the slide knob 22 is fixed to the slide frame 42 via the housing 14. When the slide knob 22 slides, the slide frame 42 moves. When the slide frame 42 moves, the lock projection 42a moves and the fixing or the fixing cancellation of the cover 16 is performed.

Figure 12:
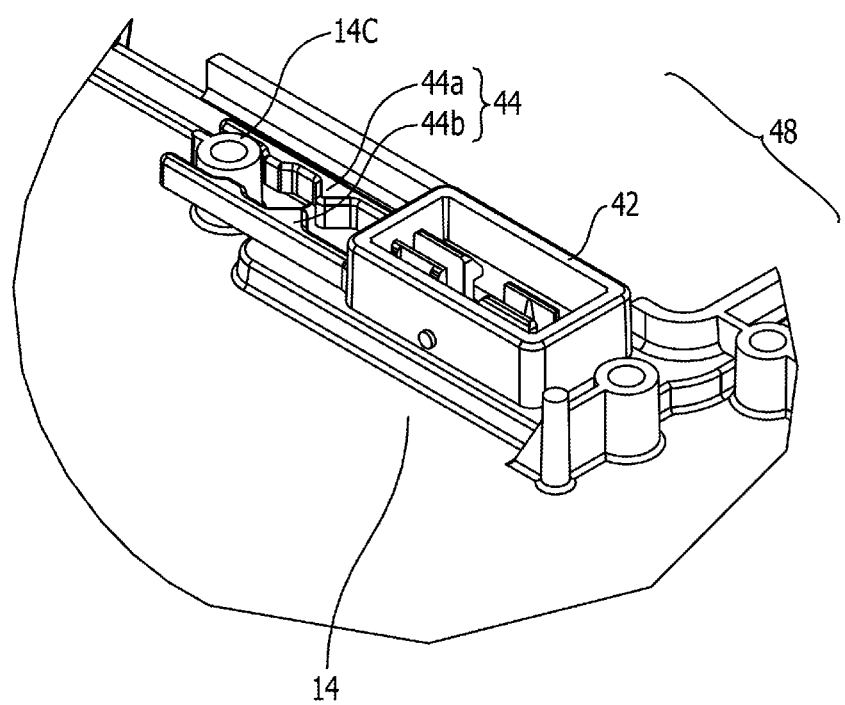
FIG. 12 illustrates an example of a latch-type slide lock mechanism.
Figure 13:
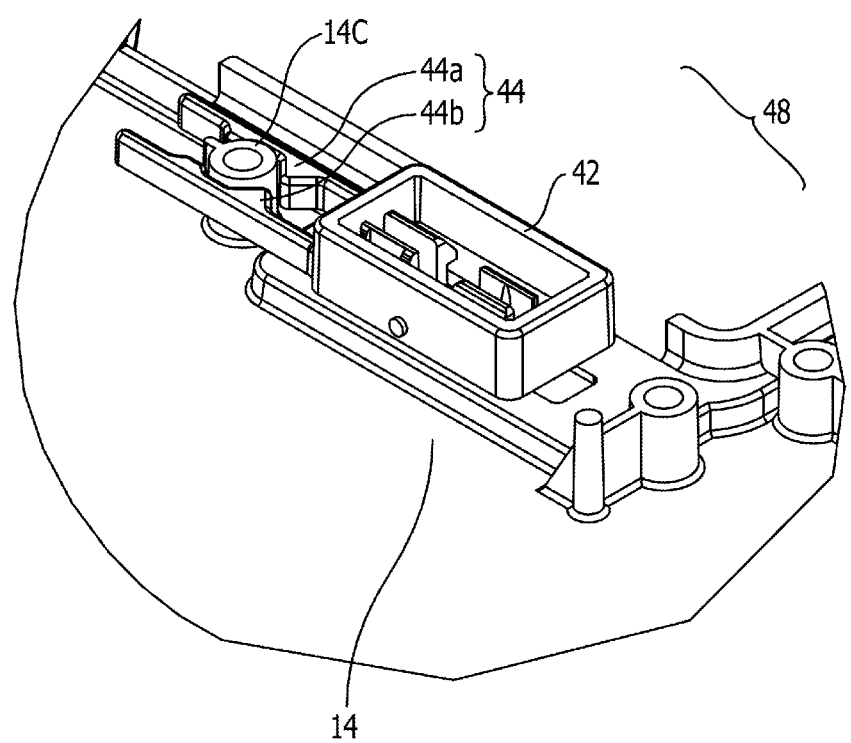
FIG. 13 illustrates an example of a latch-type slide lock mechanism.

Each of FIGS. 12 and 13 illustrates an example of an latch-type slide lock mechanism. FIG. 12 depicts a perspective view of the latch-type slide lock mechanism 40, which is viewed when the slide knob 22 is at the fixing position. FIG. 13 depicts a perspective view of the latch-type slide lock mechanism 40, which is viewed when the slide knob 22 is at the fixing canceling position.

When the slide knob 22 is at the fixing position, the slide frame 42 is at the fixing position as illustrated in FIG. 12. At this time, the latch part 44 extending from the slide frame 42 latchingly engages with the boss 14c of the housing 14 at a top end portion positioned farther from the slide frame 42. When the slide knob 22 is caused to slide to the fixing canceling position, the slide frame 42 also moves to the fixing canceling position as illustrated in FIG. 13. At this time, the latch part 44 extending from the slide frame 42 engages with the boss 14c of the housing 14 at a portion closer to the slide frame 42 than to the top end portion of the slide frame 42.

Figure 14A:
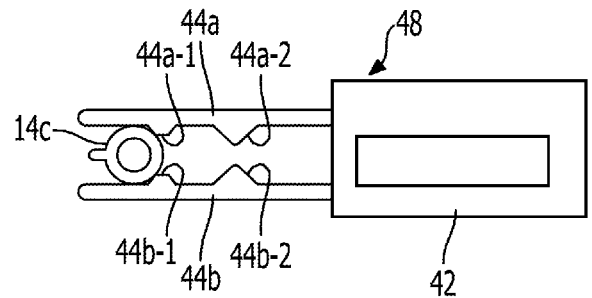
FIGS. 14A to 14D illustrate an example of latching operations.
Figure 14B:
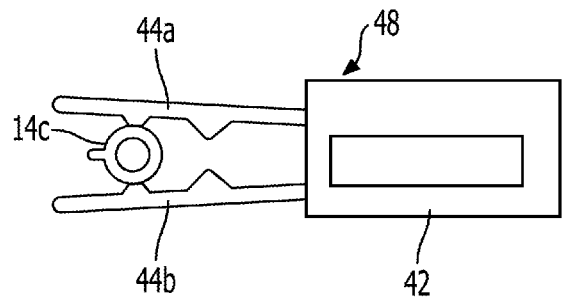
Figure 14C:
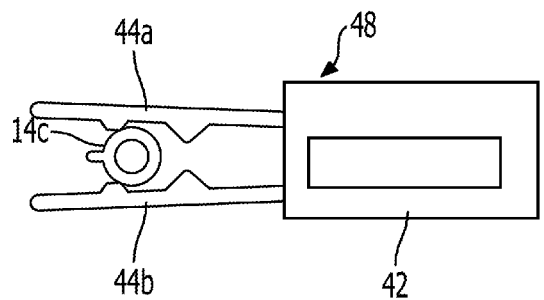
Figure 14D:
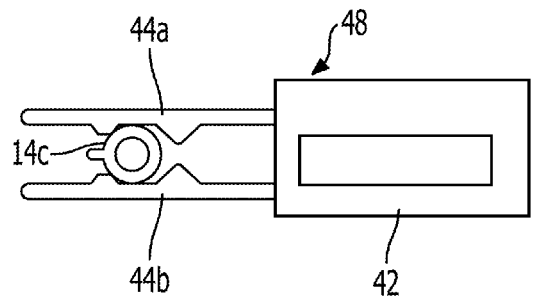

FIGS. 14A to 14C illustrate an example of latching operations. The latch part illustrated in FIGS. 14A to 14C may be the latch part 44 illustrated in FIGS. 12 and 13.

The latch part 44 includes the pair of arms 44a and 44b, sandwiches the boss 14c with the pair of arms 44a and 44b, and latchingly engages with the boss 14c. Inside the arm 44a, a first projection 44a-1 is formed on the top end side, and a second projection 44a-2 is formed on the side closer to the slide frame 42 than the first projection 44a-1. Similarly, inside the arm 44b, a first projection 44b-1 is formed on the top end side, and a second projection 44b-2 is formed on the side closer to the slide frame 42 than the first projection 44b-1. The first projection 44a-1 and the first projection 44b-1 are arranged at the positions opposite to each other. The second projection 44a-2 and the second projection 44b-2 are also arranged at the positions opposite to each other.

When the slide frame 42 is at the fixing position, the arms 44a and 44b of the latch part 44 engage with the boss 14c at a position on the top end side, which is closer to the top end than the first projection 44a-1 and the first projection 44b-1 as illustrated in FIG. 14A.

When the slide knob 22 slides from the fixing position toward the fixing canceling position, the slide frame 42 also moves and the latch part 44 moves as well. When the latch part 44 moves, the first projection 44a-1 of the arm 44a and the first projection 44b-1 of the arm 44b travel over the rim of the boss 14c as illustrated in FIG. 14B. At this time, the arms 44a and 44b are elastically deformed so that the arms 44a and 44b bend outward.

When the slide frame 42 moves further, the first projection 44a-1 of the arm 44a and the first projection 44b-1 of the arm 44b travel over the rim of the boss 14c as illustrated in FIG. 14C. Thus, the boss 14c enters between the first projections 44a-1 and 44b-1 and the second projections 44a-2 and 44b-2. At this time, returning force toward the inside acts on the arms 44a and 44b that are elastically deformed to bend outward and helps with the movement of the slide frame 42.

When the slide frame 42 moves to the fixing canceling position, the boss 14c is completely accommodated between the first projections 44a-1 and 44b-1 and the second projections 44a-2 and 44b-2. In order to cause the slide frame 42 to move back in the opposite direction from this state, a certain amount of force may be applied to the slide frame 42 or, for example, to the slide knob 22 because the first projection 44a-1 of the arm 44a and the first projection 44b-1 of the arm 44b travel over the rim of the boss 14c. Thus, the slide frame 42 remains at the fixing canceling position and the state in which the fixing of the cover 16 is canceled is maintained.

In the latch-type slide lock mechanism 40, the boss 14c is sandwiched between the pair of arms 44a and 44b. When the first projections 44a-1 and 44b-1 travel over the rim of the boss 14c, the directions in which the arms 44a and 44b are deformed may be opposite to each other. Thus, force that may displace the slide frame 42, which is connected to the base of the pair of arms 44a and 44b, in a direction perpendicular to the movement direction may be removed and no force may be applied to the slide frame 42 in the lateral direction. Accordingly, a guide for stopping the lateral displacement of the slide frame 42 or the like may be undesired and the structure of the latch-type slide lock mechanism 40 may be simplified.

In the latch-type slide lock mechanism 40, the boss 14c projecting from the housing 14 is used as a member for allowing the latch part 44 to engage and fix the position. In the spring-type slide lock mechanism 30, the boss 14b projecting from the housing 14 is used for rotatably supporting the fixing part 36. When FIGS. 9A to 9D and FIGS. 14A to 14D are compared, the relation between the positions of the slide frame 32 and the boss 14b in the spring-type slide lock mechanism 30 is substantially the same as or similar to the relation between the positions of the slide frame 42 and the boss 14c in the latch-type slide lock mechanism 40, and a common arrangement may be employed.

The cover 16 may be fixed using two independent lock mechanisms, which are the spring-type slide lock mechanism 30 and the latch-type slide lock mechanism 40. It may be undesired to provide two lock mechanisms. For example, the spring-type slide lock mechanism 30 may be provided on one side of the cover 16, and a fixing structure for merely inserting a projection into a hole formed on the side of the housing 14 may be provided on the other side of the cover 16 so that the cover 16 may be fixed to the housing 14. The fixing of the cover 16 may be canceled by the operations of the slide knob 20 of the spring-type slide lock mechanism 30.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic device comprising:
    a housing provided with an opening that accommodates a component;
    a cover member that covers the opening;
    a projecting part that projects from an inside face of the housing;
    a slide knob slidably provided to a surface of the housing; and
    an elastic slide lock member that fixes the cover member to the housing,
    wherein the elastic slide lock member includes:
    a movement part that is coupled to the slide knob, moves together with the slide knob, and is provided with a fixing projection;
    a fixing part that is rotatably supported by the projecting part of the housing; and
    a coupling part that couples the movement part and the fixing part and is elastically deformable.

2. The electronic device according to claim 1, wherein the movement part is movable in one of a direction toward the fixing part and a direction away from the fixing part.

3. The electronic device according to claim 1, wherein the coupling part is elastically deformed when the movement part moves in a direction toward the fixing part, and attempts to return to an original shape when the movement part moves in a direction away from the fixing part.

4. The electronic device according to claim 1, wherein the coupling part is a bent, long, and narrow member coupled to a portion farthest from the fixing part of the movement part and to a portion farthest from the movement part of the fixing part.

5. The electronic device according to claim 1, further comprising:
    a latch-type slide lock member that is different from the elastic slide lock member.

6. The electronic device according to claim 5, wherein the latch-type slide lock member includes:
    a second movement part that is coupled to a second slide knob slidably provided to the surface of the housing, moves together with the second slide knob, and is provided with a second fixing projection; and
    a latch part that extends from the second movement part and engages with a second projecting part projecting from the inside face of the housing.

7. The electronic device according to claim 6, wherein
the latch part includes a pair of arms that extends in a direction in which the second movement part moves, and
the pair of arms sandwiches the second projecting part therebetween and engages with the second projecting part.

8. An elastic slide lock member comprising:
a movement part that is coupled to a slide knob slidably provided to a surface of a housing of an electronic device, moves together with the slide knob, and is provided with a fixing projection;
a fixing part that is rotatably supported by a projecting part projecting from an inside face of the housing; and
a coupling part that couples the movement part and the fixing part and is elastically deformable.

9. The elastic slide lock member according to claim 8, wherein
the coupling part is elastically deformed when the movement part moves in a direction toward the fixing part, and attempts to return to an original shape when the movement part moves in a direction away from the fixing part.

10. The elastic slide lock member according to claim 8, wherein
the coupling part is a bent, long, and narrow member coupled to a portion farthest from the fixing part of the movement part and to a portion farthest from the movement part of the fixing part.

* * * * *